United States Patent [19]

Foo

[11] Patent Number: 5,347,216
[45] Date of Patent: Sep. 13, 1994

[54] FAST NMR IMAGE ACQUISITION WITH SPECTRALLY SELECTIVE INVERSION PULSE

[75] Inventor: Thomas K. Foo, Waukesha, Wis.

[73] Assignee: General Electric Company, Milwaukee, Wis.

[21] Appl. No.: 902,634

[22] Filed: Jun. 23, 1992

[51] Int. Cl.[5] .............................................. G01V 3/00
[52] U.S. Cl. ...................................................... 324/309
[58] Field of Search ............... 324/300, 307, 309, 310, 324/311, 312, 313, 314, 318, 322; 128/653.2

[56] References Cited

U.S. PATENT DOCUMENTS 5,055,790  10/1991  Siuciak et al. ...................... 324/309

OTHER PUBLICATIONS

Selective Partial Inversion Recovery (SPIR) in Steady State for Selective Saturation Magnetic Resonance Imaging (MRI), C. H. Oh, et al., SMRM 1988 (no month).

Fast Inversion Recovery $T_1$ Contrast and Chemical Shift Contrast in High-Resolution Snapshot Flash MR Images, Matthaei, et al., Magnetic Resonance Imaging, vol. 10 pp. 1-6, 1992 (no month).

Snapshot Flahs MRI, Applications to T1, T2, and Chemical-Shift Imaging, A. Haase, Magnetic Resonance In Medicine 13, 77-89 (1990) (no month).

Three-Dimensional Magnetization-Prepared Rapid Gradient-Echo Imaging (3D MP Rage), Mugler III, et al., Magnetic Resonance In Medicine 15, 152-157 (1990) (no month).

Mp Rage: A Three-Dimensional, T1-Weighted, Gradient-Echo Sequence-Initial Experience in the Brain[1], Brant-Zawadzki, et al., Radiology 1992, vol. 182 No. 3, pp. 769-775 (no month).

T2-Weighted Three-Dimensional, MR-Rage MR Imaging[1], Mugler III, et al., JMRI vol. 1 No. 6, Nov./Dec. 1991.

Primary Examiner—Michael J. Tokar
Attorney, Agent, or Firm—Quarles & Brady

[57] ABSTRACT

An NMR system performs a 3DFT scan using a set of steady-state free precession (SSFP) pulse sequences. A contrast preparation pulse sequence precedes each series of SSFP pulse sequences employed to acquire one plane through the three-dimensional space, and it includes a spectrally selective RF inversion pulse tuned to fat or water. The sequence is repeated without any magnetization recovery delays until all the planes have been acquired.

4 Claims, 4 Drawing Sheets

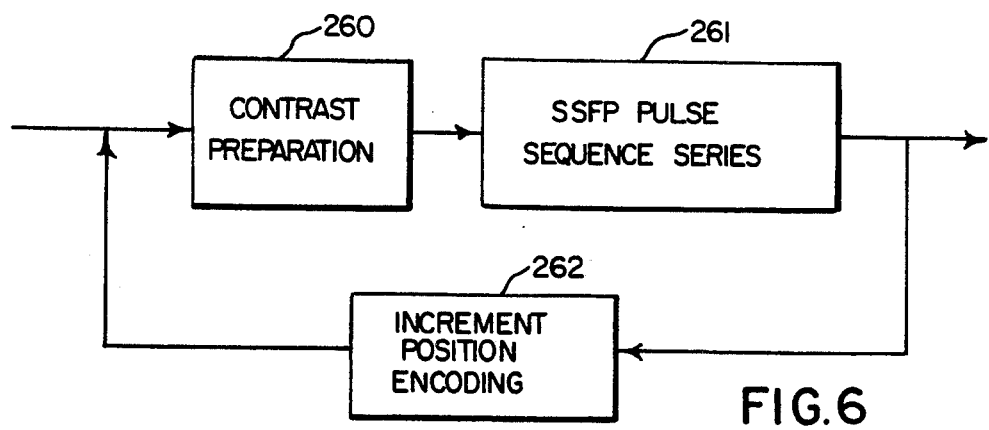
FIG. 6
FIG. 7
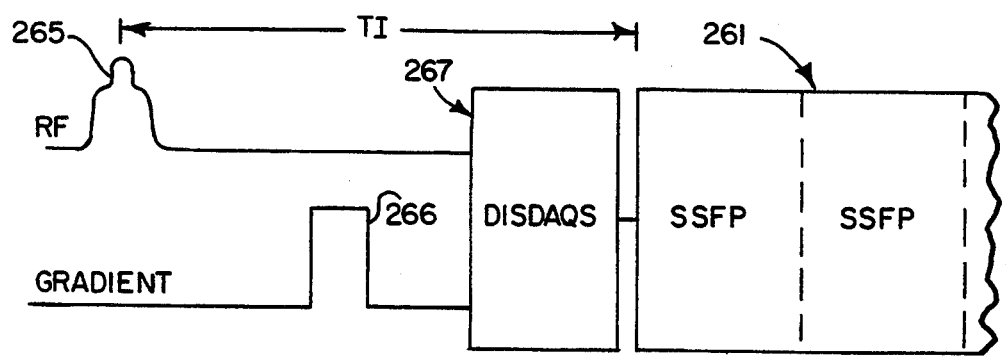
FIG. 8A
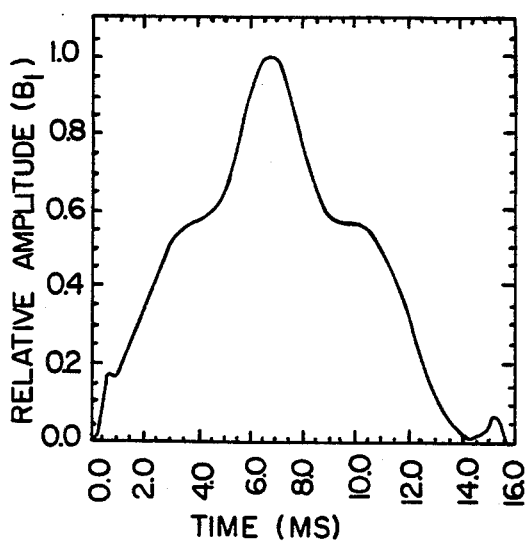
FIG. 8B
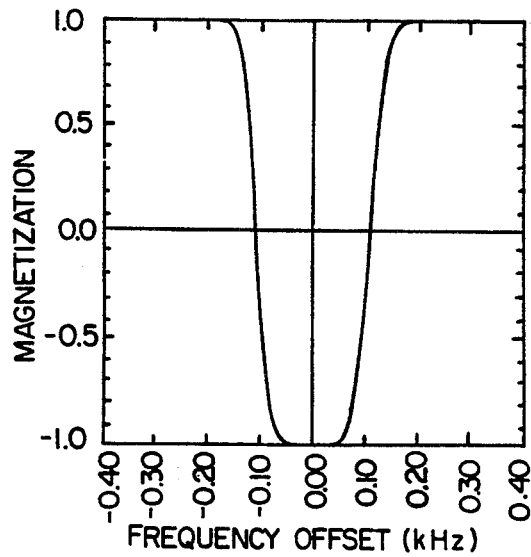

FAST NMR IMAGE ACQUISITION WITH SPECTRALLY SELECTIVE INVERSION PULSE

BACKGROUND OF THE INVENTION

The field of the invention is nuclear magnetic resonance imaging methods and systems. More particularly, the invention relates to the acquisition of an NMR image data set using a fast pulse sequence.

Any nucleus which possesses a magnetic moment attempts to align itself with the direction of the magnetic field in which it is located. In doing so, however, the nucleus precesses around this direction at a characteristic angular frequency (Larmor frequency) which is dependent on the strength of the magnetic field and on the properties of the specific nuclear species (the magnetogyric constant $\gamma$ of the nucleus). Nuclei which exhibit this phenomena are referred to herein as "spins".

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. A net magnetic moment $M_z$ is produced in the direction of the polarizing field, but the randomly oriented magnetic components in the perpendicular, or transverse, plane (x-y plane) cancel one another. If, however, the substance, or tissue, is subjected to a magnetic field (excitation field $B_1$) which is in the x-y plane and which is near the Larmor frequency, the net aligned moment, $M_z$, may be rotated, or "tipped", into the x-y plane to produce a net transverse magnetic moment $M_t$, which is rotating, or spinning, in the x-y plane at the Larmor frequency.

The practical value of this phenomenon resides in the signal which is emitted by the excited spins after the excitation signal $B_1$ is terminated. In simple systems the excited spins induce an oscillating sine wave signal in a receiving coil. The frequency of this signal is the Larmor frequency, and its initial amplitude, $A_0$, is determined by the magnitude of the transverse magnetic moment $M_t$. The amplitude, A, of the emission signal decays in an exponential fashion with time, t:

$$A = A_0 e^{-t/T^*_2}$$

The decay constant $1/T^*_2$ depends on the homogeneity of the magnetic field and on $T_2$, which is referred to as the "spin-spin relaxation" constant, or the "transverse relaxation" constant. The $T_2$ constant is inversely proportional to the exponential rate at which the aligned precession of the spins would dephase after removal of the excitation signal $B_1$ in a perfectly homogeneous field. The practical value of the $T_2$ constant is that tissues have different $T_2$ values and this can be exploited as a means of enhancing the contrast between such tissues.

Another important factor which contributes to the amplitude A of the NMR signal is referred to as the spin-lattice relaxation process which is characterized by the time constant $T_1$. It describes the recovery of the net magnetic moment M to its equilibrium value along the axis of magnetic polarization (z). The $T_1$ time constant is longer than $T_2$, much longer in most substances of medical interest. As with the $T_2$ constant, the difference in $T_1$ between tissues can be exploited to provide image contrast.

When utilizing NMR to produce images, a technique is employed to obtain NMR signals from specific locations in the subject. Typically, the region which is to be imaged (region of interest) is scanned by a sequence of NMR measurement cycles which vary according to the particular localization method being used. The resulting set of received NMR signals are digitized and processed to reconstruct the image using one of many well known reconstruction techniques. To perform such a scan, it is, of course, necessary to elicit NMR signals from specific locations in the subject. This is accomplished by employing magnetic fields ($G_x$, $G_y$, and $G_z$) which have the same direction as the polarizing field $B_0$, but which have a gradient along the respective x, y and z axes. By controlling the strength of these gradients during each NMR cycle, the spatial distribution of spin excitation can be controlled and the location of the resulting NMR signals can be identified.

Most NMR scans currently used to produce medical images require many minutes to acquire the necessary data. The reduction of this scan time is an important consideration, since reduced scan time increases patient throughput, improves patient comfort, and improves image quality by reducing motion artifacts. There is a class of pulse sequences which have a very short repetition time (TR) and result in complete scans which can be conducted in seconds rather than minutes. Whereas the more conventional pulse sequences have repetition times TR which are much greater than the spin-spin relaxation constant $T_2$ so that the transverse magnetization has time to relax between the phase coherent excitation pulses in successive sequences, the fast pulse sequences have a repetition time TR which is less than $T_2$ and which drives the transverse magnetization into a steady-state of equilibrium. Such techniques are referred to as steady-state free precession (SSFP) techniques and they are characterized by a cyclic pattern of transverse magnetization in which the resulting NMR signal refocuses at each RF excitation pulse to produce an echo signal. This echo signal includes a first part S+ that is produced after each RF excitation pulse and a second part S− which forms just prior to the RF excitation pulse.

There are two well known SSFP pulse sequences used to produce images. The first is called gradient refocused acquired steady-state (GRASS) and it utilizes a readout gradient $G_x$ to shift the peak in the S+ signal that is produced after each RF excitation pulse toward the center of the pulse sequence. This pulse sequence is shown in FIG. 3, where the NMR signal is an S+ gradient echo that is induced by the readout gradient $G_x$. In two-dimensional imaging, a slice selection gradient pulse is produced by the gradient $G_z$ and is immediately refocused in the well-known manner. A phase encoding gradient pulse $G_y$ is produced shortly thereafter to position encode the acquired NMR data, and to preserve the steady-state equilibrium, the effects of the phase encoding gradient pulse are nullified by a corresponding $G_y$ rewinder gradient pulse after the NMR signal has been acquired and before the next pulse sequence begins as described in U.S. Pat. No. 4,665,365.

The second well known SSFP pulse sequence is called contrast enhanced fast imaging (SSFP-ECHO) and it utilizes the S− signal that is produced just prior to each RF excitation pulse. This pulse sequence is shown in FIG. 4, where the acquired NMR signal is an S− echo signal caused by the gradient refocusing of the transverse magnetization which would otherwise refocus at the next RF excitation pulse. The readout gradient $G_x$ is substantially different in this pulse sequence and includes a positive pulse prior to the actual readout pulse and a negative pulse after the readout pulse. The former pulse dephases the FID signal (S+) which might otherwise be produced during the data acquisition window, and the latter pulse causes the transverse magnetization to rephase during the next pulse sequence to produce the echo signal S−. For a more detailed discussion of the SSFP-ECHO pulse sequence, reference is made to an article by R. C. Hawkes and S. Patz entitled "Rapid Fourier Imaging Using Steady-State Free Precision", published in Magnetic Resonance in Medicine 4, pp. 9–23 (1987).

Because SSFP sequences employ RF excitation pulses with small tip angles and the magnetization is not allowed to recover after each pulse sequence, the image contrast due to spin density is not nearly as good as with conventional pulse sequences. Consequently, other image contrast enhancement methods have been proposed which rely on the different $T_1$ and $T_2$ constants of tissues. As described by A. Haase in "Snapshot Flash MRI Applications to T1, T2, and Chemical-Shift Imaging," *Magnetic Resonance In Medicine,* 13, 77–89 (1990), and D. Matthaei et al in "Fast Inversion Recovery $T_1$ Contrast and Chemical Shift Contrast In High-Resolution Snapshot Flash MR Images," *Magnetic Resonance Imaging,* Vol 10, pp. 1–6, 1992, a series of SSFP pulse sequences may be preceded by one or more preparatory RF pulses which condition the spin magnetization to provide $T_1$ or $T_2$ enhanced contrast images. In some 2D acquisitions a single preparatory period followed by the acquisition of all the image views will suffice. However, in 3D acquisitions and in multi-slice 2D acquisitions the scan is divided into a series of data acquisition periods which are each preceded by a contrast enhancement preparatory period. In addition, and as described by J. P. Mugler et al in "Three-Dimensional Magnetization-Prepared Rapid Gradient-Echo Imaging (3D MP RAGE)," *Magnetic Resonance In Medicine* 15, 152–157 (1990); by M. Brant-Zawadzki in "MP RAGE: A Three-Dimensional, T1-Weighted, Gradient-Echo Sequence—Initial Experience in the Brain," *Radiology* 1992; 182: 769–775; and by J. P. Mugler et al in "T2-Weighted Three-Dimensional MP-RAGE MR Imaging," *JMRI* 1991:1:731–737; each data acquisition period is followed by a recovery period. Each recovery period enables the spin magnetization to return to thermal equilibrium from the lower steady-state equilibrium attained during the previous SSFP acquisition period. For example, in a typical 3D, T1-weighted, magnetization prepared scan, each prepatory period may require from 300 to 500 milliseconds, followed by n SSFP acquisition periods of between 6 to 12 milliseconds each, where n is the number of sections prescribed. This is followed by a recovery period which may require 1 to 2 seconds. This sequence might be repeated m times, where m is the in-plane resolution in the phase encoding direction. Typically, a 3D T1-weighted scan requires 64 sections and has an in-plane resolution in the phase encoding direction 256, for a total scan time of 548 seconds (9.13 minutes).

Rapid acquisition of fat suppressed images is essential in the diagnosis of breast lesions. SSFP pulse sequences inherently provide images with good $T_1$ contrast. By injecting the patient with a contrast agent such as Gadolinium, the $T_1$ constant of tumor cells is shortened relative to the surrounding muscle and fiber tissues and produces a characteristic pattern in an SSFP image. However, fat tissues also have a short $T_1$ time, and they will also appear brightly in the image. These images must be acquired within two to three minutes in order to maximize the effect of the Gadolinium tumor contrast agent, and the signals from fat tissues must be suppressed so that the tumor can be seen against the background of other tissues which have a longer $T_1$ time. In addition, these images must be rapidly acquired before the Gadolinium has perfused through normal tissues which tend to mask the signal from tumors.

SUMMARY OF THE INVENTION

The present invention relates to a fast NMR scan which employs a series of steady-state free precession pulse sequences to acquire either a 2DFT or 3DFT NMR data set. More specifically, the present invention is an NMR system which performs a scan as a set of SSFP pulse sequences which sample space by stepping a position encoding magnetic field gradient through a set of values, in which the set of SSFP pulse sequences is divided into a plurality of SSFP pulse sequence series and each SSFP pulse sequence series is preceded by a contrast preparation pulse sequence. No recovery period occurs between the end of one SSFP pulse sequence series and the contrast preparation pulse sequence which precedes the next SSFP pulse sequence series, so that a dynamic equilibrium of the spin magnetization is achieved and maintained substantially constant throughout the scan. A spectrally selective RF inversion pulse is produced during each contrast preparation pulse sequence to suppress the signals produced by a selected spin species such as lipids or water.

A general object of the invention is to shorten the acquisition period for a fast 2DFT or 3DFT NMR scan. By eliminating the 1 to 2 second recovery period normally inserted between each SSFP pulse sequence series, there is little dead time in which data is not being acquired. In addition, because the magnetization is not allowed to recover between SSFP pulse sequence series, the time interval (TI) between the spectrally selective RF inversion pulse and the start of data acquisition can be shortened, resulting in a shortening of each contrast preparation pulse sequence as well.

A more specific object of the invention is to acquire large amounts of NMR data in a short time interval and to suppress the signal from selected spin species. An entire 3DFT data set can be acquired in 2 to 3 minutes with an NMR system employing the present invention, and signals from fat or water or other spin species may be selectively suppressed. This enables, for example, breast lesions to be imaged before the enhancement effect of Gadolinium dissipates and without the strong signal produced by fat.

The foregoing and other objects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims herein for interpreting the scope of the invention.

BRIEF DESCRIPTION OF THE DRAWINGS

FIG. 6 is a schematic representation of the scan employed by the NMR system of FIG. 1 to practice the present invention;

FIG. 7 is a schematic representation of a portion of the scan in FIG. 6, which illustrates in more detail the contrast preparation;

FIGS. 8A and 8B are respective graphic representations of the spectrally selective RF inversion pulse envelope employed in the contrast preparation of FIG. 7, and the resulting effect on spin magnetization.

DETAILED DESCRIPTION OF THE INVENTION

Figure 1:
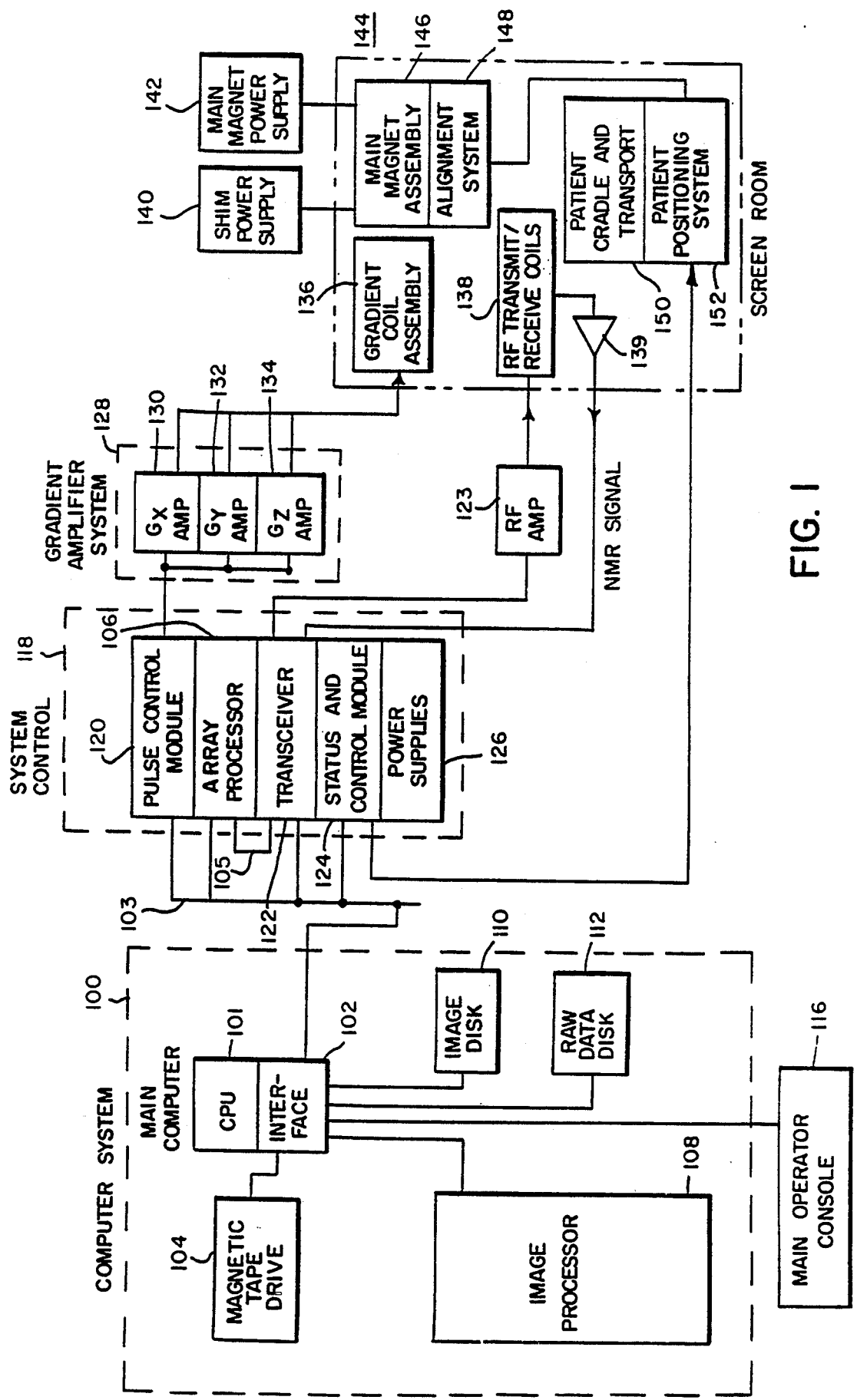
FIG. 1 is a block diagram of an NMR system which employs the present invention.

Referring first to FIG. 1, there is shown in block diagram form the major components of a preferred NMR system which incorporates the present invention and which is sold by the General Electric Company under the trademark "SIGNA". The overall operation of the system is under the control of a host computer system generally designated 100 which includes a main computer 101 (such as a Data General MV7800). The computer has associated therewith an interface 102 through which a plurality of computer peripheral devices and other NMR system components are coupled. Among the computer peripheral devices is a magnetic tape drive 104 which may be utilized under the direction of the main computer for archiving patient data and images to tape. Processed patient data may also be stored in an image disc storage device designated 110. The function of image processor 108 is to provide interactive image display manipulation such as magnification, image comparison, gray-scale adjustment and real-time data display. The computer system is provided with a means to store raw data (i.e. before image construction) utilizing a disc data storage system designated 112. An operator console 116 is also coupled to the computer by means of interface 102 and provides the operator with the means to input data pertinent to a patient study as well as additional data necessary for proper NMR system operation, such as calibrating, initiating and terminating scans. The operator console is also used to display images stored on discs or magnetic tape.

The computer system 100 exercises control over the NMR system by means of system control 118 and gradient amplifier system 128. The computer 100 communicates with system control 118 by means of a link 103 in a manner well known to those skilled in the art. The system control 118 includes several subsystems such as a pulse control module (PCM) 120, an array processor 106, a radio frequency transceiver 122, a status and control module (SCM) 124, and the power supplies generally designated 126 necessary to energize the components. The PCM 120 utilizes control signals provided by main computer 101 to generate digital timing and control signals such as the digital waveforms which control gradient coil excitation, as well as RF envelope waveforms utilized in the transceiver 122 for modulating the RF excitation pulses. The gradient waveforms are applied to the gradient amplifier system 128 generally comprised of $G_x$, $G_y$ and $G_z$ amplifiers 130, 132 and 134, respectively. Each amplifier 130, 132 and 134 is utilized to excite a corresponding gradient coil in an assembly generally designated 136. When energized, the gradient coils generate magnetic field gradients $G_x$, $G_y$ and $G_z$ of the magnetic field in the same direction as the main polarizing magnetic field, wherein the gradients are directed in mutually orthogonal X-, Y- and Z-axis directions of a Cartesian coordinate system. That is, if the magnetic field generated by the main magnet (not shown) is directed in the z direction and is termed $B_0$, and the total magnetic field in the z direction is referred to as $B_z$, then $G_x = \partial B_z/\partial x$, $G_y = \partial B_z/\partial y$ and $G_z = \partial B_z/\partial z$, and the magnetic field at any point (x, y, z) is given by $B(x, y, z) = B_0 + G_x X + G_y Y + G_z Z$.

The gradient magnetic fields are utilized in combination with radio frequency pulses generated by transceiver 122, RF amp 123 and RF coil 138 to encode spatial information into the NMR signals emanating from the region of the patient being studied. Waveforms and control signals provided by the pulse control module 120 are utilized by the transceiver subsystem 122 for RF carrier modulation and mode control. In the transmit mode, the transmitter provides a radio frequency waveform modulated in accordance with the control signals to an RF power amplifier 123 which then energizes RF coil 138 which is situated within main magnet assembly 146. The NMR signals radiated by the excited nuclei in the patient are sensed by the same or a different RF coil than is used for transmitting and amplified by a preamplifier 139. The NMR signals are amplified, demodulated, filtered, and digitized in the receiver section of the transceiver 122. The processed NMR signals are transmitted to the array processor 106 for processing by means of a dedicated, unidirectional link 105.

The PCM 120 and SCM 124 are independent subsystems both of which communicate with main computer 101, peripheral system, such as patient positioning system 152, as well as to one another by means of serial communications link 103. The PCM 120 and SCM 124 are each comprised of a 16-bit microprocessor (such as Intel 80286) for processing commands from the main computer 101. The SCM 124 includes means for acquiring information regarding patient cradle position, and the position of the moveable patient alignment light fan beam (not shown). This information is used by main computer 101 to modify image display and reconstruction parameters. The SCM 124 also initiates functions such as actuation of the patient transport and alignment systems.

The gradient coil assembly 136 and the RF transmit and receiver coils 138 are mounted within the bore of the magnet utilized to produce the polarizing magnetic field. The magnet forms a part of the main magnet assembly which includes the patient alignment system 148. A shim power supply 140 is utilized to energize a shim coil associated with the main magnet and which are used to correct inhomogeneities in the polarizing magnet field. In the case of a superconductive magnet, the main power supply 142 is utilized to bring the polarizing field produced by the magnet to the proper operating strength and is then disconnected. The patient alignment system 148 operates in combination with a patient cradle and transport system 150 and patient positioning system 152. To minimize interference from external sources, these NMR system components are enclosed in an RF-shielded room generally designated 144.

Figure 2:
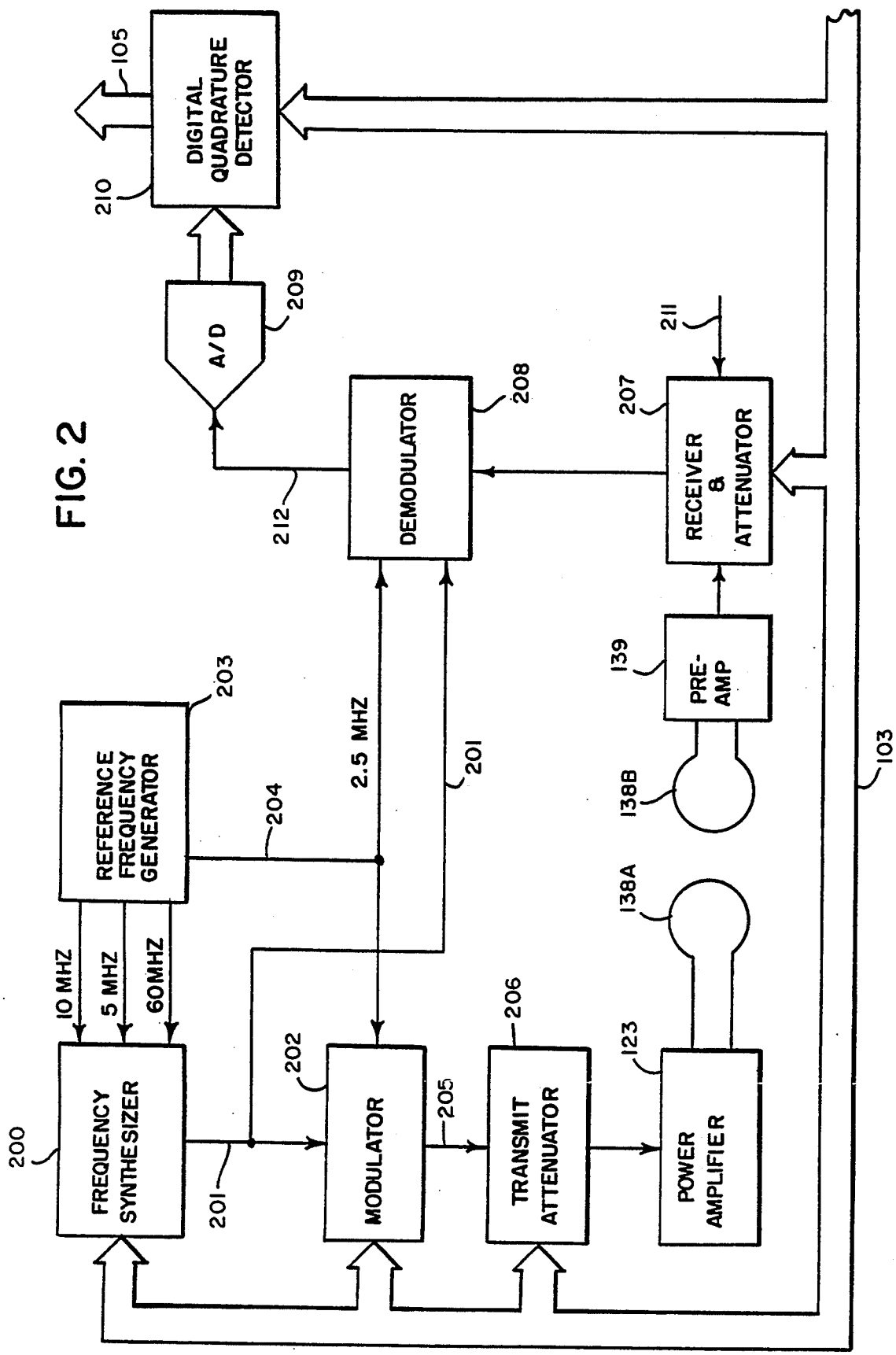
FIG. 2 is an electrical block diagram of the transceiver which forms part of the NMR system of FIG. 1.

Referring particularly to FIGS. 1 and 2, the transceiver 122 includes components which produce the RF excitation field $B_1$ through power amplifier 123 at a coil 138A and components which receive the resulting NMR signal induced in a coil 138B. The base, or carrier, frequency of the RF excitation field is produced under control of a frequency synthesizer 200 which receives a set of digital signals (CF) through the communications link 103 from the main computer 101. These digital signals indicate the frequency and phase of the RF carrier signal which is produced at an output 201. The commanded RF Carrier is applied to a modulator 202 where it is modulated in response to a signal R(t) received through the link 103 from the PCM 120. The signal R(t) defines the envelope, and therefore the bandwidth, of the RF excitation pulse to be produced. It is produced in the PCM 120 by sequentially reading out a series of stored digital values as the RF excitation pulse is produced that represent the desired envelope. These stored digital values may, in turn, be changed by the computer 100 to enable any desired RF pulse envelope to be produced. The magnitude of the RF excitation pulse output through line 205 is attenuated by a transmit attenuator circuit 206 which receives a digital signal, TA, from the main computer 101 through communications link 103. The attenuated RF excitation pulses are applied to the power amplifier 123 that drives the RF transmitter coil 138A. For a more detailed description of this portion of the transceiver 122, reference is made to U.S. Pat. No. 4,952,877 which is incorporated herein by reference.

Referring still to FIGS. 1 and 2 the NMR signal produced by the subject is picked up by the receiver coil 138B and applied to the input of a receiver 207. The receiver 207 amplifies the NMR signal and this is attenuated by an amount determined by a digital attenuation signal (RA) received from the main computer 101 through link 103. The receiver 207 is also turned on and off by a signal through line 211 from the PCM 120 such that the NMR signal is acquired only over the time intervals required by the particular acquisition being performed.

The received NMR signal is at or around the Larmor frequency, which in the preferred embodiment is around 63.86 MHz. This high frequency signal is demodulated in a two step process in a demodulator 208 which first mixes the NMR signal with the carrier signal on line 201 and then mixes the resulting difference signal with the 2.5 MHz reference signal on line 204. The resulting demodulated NMR signal on line 212 has a bandwidth of 125 kHz and it is centered at a frequency of 187.5 kHz. The demodulated NMR signal is applied to the input of an analog-to-digital (A/D) converter 209 which samples and digitizes the analog signal at a rate of 250 kHz. The output of the A/D converter 209 is applied to a digital quadrature detector 210 which produces 16-bit in-phase (I) values and 16-bit quadrature (Q) values corresponding to the received digital signal. The resulting stream of digitized I and Q values of the received NMR signal is output through bus 105 to the array processor where they are employed to reconstruct an image.

To preserve the phase information contained in the received NMR signal, both the modulator 202 in the transmitter section and the demodulator 208 in the receiver section are operated with common signals. More particularly, the carrier signal at the output 201 of the frequency synthesizer 200 and the 2.5 MHz reference signal at the output 204 of the reference frequency generator 203 are employed in both the modulation and the demodulation process. Phase consistency is thus maintained and phase changes in the demodulated received NMR signal accurately indicate phase changes produced by the excited spins. The 2.5 MHz reference signal as well as 5, 10 and 60 MHz reference signals are produced by the reference frequency generator 203 from a common 10 MHz clock signal, and the latter three reference signals are employed by the frequency synthesizer 200 to produce the carrier signal on output 201. For a more detailed description of the receiver, reference is made to U.S. Pat. No. 4,992,736 which is incorporated herein by reference.

Figure 3:
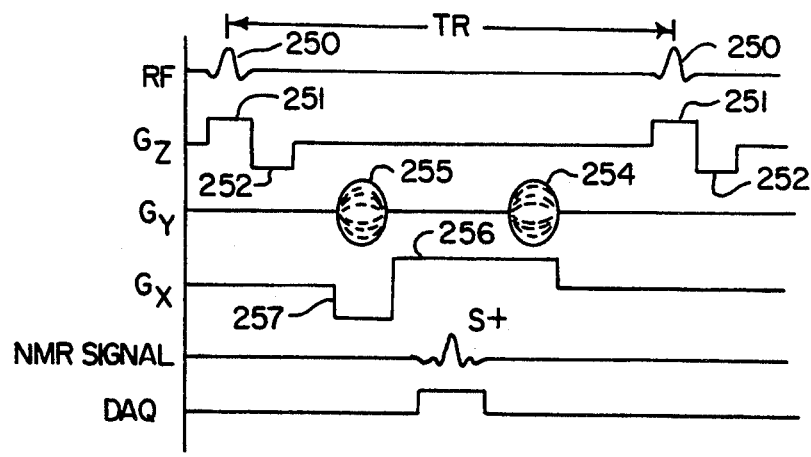
FIGS. 3 and 4 are graphic representations of two steady-state free precession (SSFP) pulse sequences which may be employed by the NMR system of FIG. 1 in a 2DFT scan according to the present invention.
Figure 4:
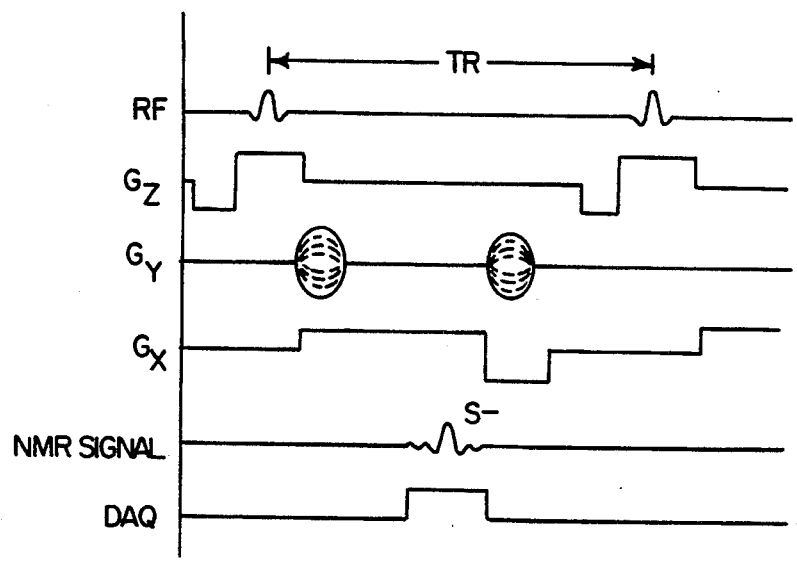
Figure 5:
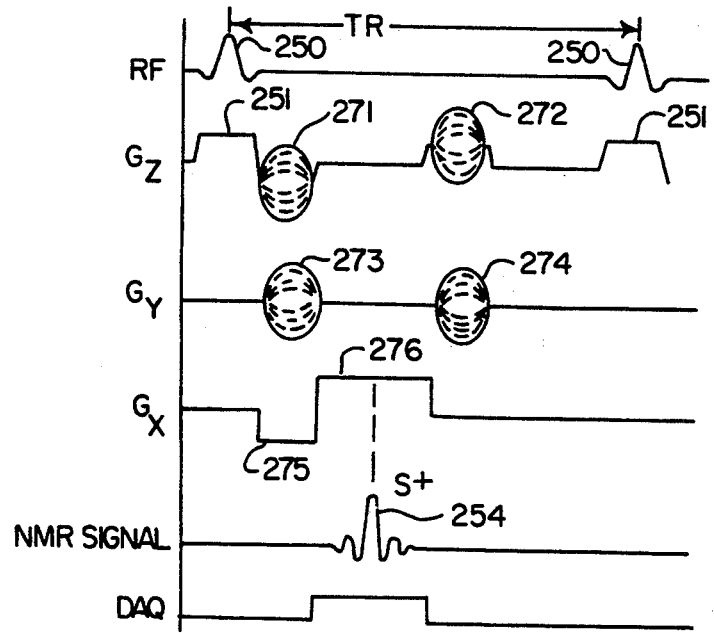
FIG. 5 is a graphic representation of a 3DFT SSFP pulse sequence, which may be employed by the NMR system of FIG. 1 to practice the present invention.

The pulse sequences used in the preferred embodiments of the invention are shown in FIGS. 3 and 5. These are 2DFT and 3DFT SSFP pulse sequences, respectively. Although S+ SSFP pulse sequences are preferred, the invention is also easily applied to 2DFT and 3DFT S− SSFP pulse sequences. The selected pulse sequence is downloaded to the PCM 120 (FIG. 1) and is played out during the scan to control the transceiver 122 and gradient amplifiers 128. At the completion of the scan the acquired NMR data set is processed in the well known manner to reconstruct an image. In the case of the 2DFT data, a set of contiguous slices are acquired through the patient and a two-dimensional Fourier transformation is performed on each slice to produce a corresponding set of images. The 3DFT data, on the other hand is processed with a three-dimensional Fourier transformation and an image may be reconstructed from any projection angle through the resulting three-dimensional array of image data.

Referring particularly to FIG. 3, the 2DFT fast pulse sequence is characterized by a series of RF excitation pulses 250 which have a magnitude and duration sufficient to tip the net magnetization by an angle of less than 90°. In the preferred embodiment a tip angle of 10° to 40° is employed. The RF excitation pulses 250 are spaced apart by a very short repetition time (TR) typically in the range of 6 to 12 milliseconds. This repetition time is less than the spin-spin relaxation time $T_2$ of water and tissue and a steady-state equilibrium is established after a few pulses in which the transverse magnetization cycles between a maximum, a minimum and back to a maximum during each interval TR.

The 2DFT pulse sequence of FIG. 3 uses the z axis magnetic field gradient $G_z$ to select a slice of spins for the measurement. More specifically, the RF excitation pulses 250 are spatially selective, and a $G_z$ gradient pulse 251 is produced at the same time to excite spins in the desired slice. A $G_z$ gradient rephasing pulse 252 is produced after each slice select pulse 251 to rephase the spin prior to the subsequent readout of the S+ NMR signal. Position along the Y axis is phase encoded into the S+ NMR signal by a $G_y$ phase encoding gradient pulse 255. This phase encoding occurs before the S+ NMR signal is acquired and a second $G_y$ pulse 254 rewinds, or rephases, the spins to maintain equilibrium. The amplitude of these phase encoding pulses 254 and 255 are equal to each other, but they are changed from view-to-view to acquire NMR data for a complete scan.

Positioned between these phase encoding gradient pulses 254 and 255 is a readout gradient pulse 256 which is applied as the S+ NMR signal is acquired. This readout gradient pulse 256 refocuses the S+ NMR signal and it frequency encodes the acquired data in the well known manner. In addition, a negative $G_x$ gradient pulse 257 is produced prior to the readout pulse 256 to dephase the spins and set up the production of the S+ NMR echo signal.

The pulse sequence of FIG. 5 is substantially the same as that of FIG. 3, except that is is employed with a 3DFT reconstruction method. The difference between the pulse sequences used for 2DFT and 3DFT reconstruction methods lies in the $G_z$ magnetic field gradient pulses. A selective 3DFT sequence is shown in which a $G_z$ gradient pulse 251 is applied concurrently with the RF excitation pulse 250. A $G_z$ pulse 271 is applied immediately thereafter and functions as a combined rephasing lobe of the slice selection gradient and as a slice encoding gradient. After the acquisition of the NMR signal, a third $G_z$ gradient pulse 272 is applied and functions as a crusher gradient on the z-axis to spoil the S-SSFP signal, and as a slice encoding rewinder pulse. The $G_z$ gradient pulses 271 and 272 are stepped through n values, where n is the number of samples acquired along the z-axis. The $G_y$ phase encoding gradient includes a first pulse 273 which phase encodes the signal prior to acquisition, and a second, rewinder pulse 274 which is applied after signal acquisition. The pulses 273 and 274 are stepped through m values during the scan, where m is the number of samples acquired along the y-axis. And finally, the $G_x$ readout gradient includes a dephasing lobe 275 and a readout gradient lobe 276. The data acquisition window is concurrent with the $G_x$ readout pulse 276 and the NMR S+ signal 254 is sampled 256 times during each acquisition. During the scan, the $G_y$ and $G_z$ phase encoding gradient pulses are stepped through their appropriate imaging values and the NMR signals 254 are acquired, digitized and processed in the well known manner.

In either the 2DFT or 3DFT scan a series of these SSFP pulse sequences are conducted in which one of the position encoding gradients is stepped through its values. In the preferred embodiments, the phase encoding $G_y$ gradient is stepped through 128 values. At the completion of this series, another gradient is stepped, or incremented, to its next value and the series of SSFP pulse sequences is repeated. In the preferred embodiments, the $G_z$ gradient is stepped through 32 values. This sequence repeats until all values of the second gradient have been acquired.

The scan according to the teachings of the present invention is illustrated in FIG. 6. The NMR system enters into a loop in which it performs a contrast preparation sequence indicated by process block 260 followed by a series of SSFP pulse sequences indicated by process block 261. The series of SSFP pulse sequences are either 2DFT or 3DFT sequences as described above, and at the completion of the series, the $G_z$ gradient is incremented to its next level as indicated at process block 262. The system immediately loops back to perform another contrast preparation sequence and another series of SSFP sequences with the new $G_z$ position encoding value. One of the important aspects of the present invention is that there is no recovery period in this loop and that contrast preparation is performed on a spin system which is substantially unchanged from the steady-state equilibrium condition which exists at the completion of the SSFP pulse sequence series. As will be discussed below, a number of important advantages flow from this aspect of the invention.

Referring particularly to FIG. 7, another aspect of the present invention is the contrast preparation pulse sequence used in connection with the above scanning steps. More specifically, it includes a spectrally selective RF inversion pulse 265 which is produced at a time interval (TI) before the commencement of the series of SSFP pulse sequences 261. When diagnosing breast lesions this pulse is shaped to invert only the fat protons, while spins associated with other breast tissues are substantially unaffected by the contrast preparation sequence 260. The time interval (TI) is selected such that the magnetization produced by the lipid spins recovers to approximately zero when the SSFP pulse sequence series 261 is begun. This is approximately 140 milliseconds during the initial pass when magnetization is fully recovered, but drops to approximately 60 milliseconds for subsequent passes, when lipid spins have reached their dynamic equilibrium magnetization. In contrast, the spins associated with other breast tissues are unaffected by the spectrally selective inversion pulse (tuned to lipids) and they maintain the magnetization established at their dynamic equilibrium. As a result, the lipid spins produce little signal and the reconstructed image has a normal $T_1$ contrast associated with SSFP sequences, but with fat suppressed. The shorter $T_1$ time of a Gadolinium laden breast lesion appears brighter than the surrounding tissues and is not obscured by the suppressed lipid signals which also have a short $T_1$ time.

The contrast preparation sequence 260 may also include a gradient pulse 266 which serves to dephase any residual transverse magnetization from the inversion pulse 265. Also, prior to the collection of data using the SSFP pulse sequence series 261, a series of SSFP pulse sequences in which no data is acquired is executed. Such pulse sequences are referred to as "disdaqs" and are indicated in FIG. 8 by process block 267. These are necessary to stabilize the magnetization as it recovers from the inversion pulse 265, and it is another benefit of the present invention that the number of disdaq pulse sequences can be reduced from the typical value of eight to a value of four in the preferred embodiment. This further shortens the overall scan time. As dynamic equilibrium is maintained for the non-lipid (or unsuppressed) spins, rf phase spoiling of the S+ SSFP signal can be employed with minimal image artifacts to further enhance image T1 contrast. Such RF phase spoiling is not possible with other techniques as a steady state is not maintained for the imaged species. In addition, with rf phase spoiling, the number of disdaq pulse sequences can be further reduced to zero, depending on the flip angle chosen.

The spectrally selective RF inversion pulse 265 is a 16 millisecond quadratic phase pulse whose magnitude profile is shown in FIG. 8A. The flip angle of this pulse is 180° and the range of frequencies which are inverted thereby is illustrated in FIG. 8B. The frequency of the inversion pulse 265 is set to the Larmor frequency of the spins being selected for suppression, which in the case of lipids in a 1.5 Tesla polarizing magnetic field is approximately −220 Hertz from the water resonance of 63.86 MHz. The Larmor frequency of other tissues of interest in a 1.5 Tesla field are offset by more than 0.10 kHz from this selected frequency range and are substantially unaffected by the inversion pulse 265.

In a first preferred embodiment of the invention the 3DFT SSFP pulse sequence of FIG. 5 is employed with a TR of 8 to 15 milliseconds to image breast lesions. The RF inversion pulse 265 is tuned to suppress lipids, and the time interval (TI) is set to 160 milliseconds during the first contrast preparation pulse sequence of the scan and is shortened to 80 milliseconds during subsequent contrast preparation pulse sequences. Four disdaq pulse sequences are employed just prior to each SSFP pulse sequence series. During each SSFP pulse sequence series the $G_z$ gradient is stepped through all of its values in a centric view order to acquire NMR data for one x-z plane through the three-dimensional space. The $G_y$ phase encoding gradient is then incremented to its next value and the contrast preparation/SSFP pulse sequence series is immediately repeated to acquire another x-z plane. The entire scan with 128 samples along the y gradient, 256 samples along the x gradient and 32 samples along the z axis requires 57 seconds, which is within the target acquisition period required for breast examinations using Gadolinium contrast agents.

In a second preferred embodiment an identical 3DFT scan is performed, but the selective inversion pulse 265 is tuned to the water resonance of 63.86 MHz to suppress water rather than fat. This resulting image of the breast is particularly useful in detecting leaks in silicon breast implants.

The third embodiment of the invention employs the 2DFT SSFP pulse sequence of FIG. 3 with a TR of 6–14 milliseconds. For fat suppression, preparation times of between 100 and 120 milliseconds are typically used for the first excitation and much shorter preparation times (50 to 80 milliseconds) are used for subsequent excitation. A minimal, or zero recovery period is used. In a typical prepared 2DFT scan, 128 samples along the y-axis are acquired with 256 samples along the x-axis. Centric view acquisition order is used to enhance contrast from the preparation segment. Total scan times for a single excitation 2DFT scan is between 1.0 to 2.0 seconds. Another advantage to applying inversion or preparatory pulses in the steady state is that the k-space acquisition can be segmented without suffering from increased scan time or loss of image resolution. In fact, by segmentation of the k-space acquisition, variations in the signal intensities or the weighting between different (k) spatial frequencies can be minimized. This improves image contrast and resolution.

We claim:

1. In an NMR system, a method for conducting a scan comprised of a set of steady-state free precession pulse sequences in which a magnetic field gradient is stepped through a corresponding set of values to acquire NMR data from which an image is reconstructed, the steps comprising:

a) performing a contrast preparation pulse sequence which includes producing a spectrally selective RF inversion pulse which is tuned to the Larmor frequency of a selected spin species to be suppressed in the reconstructed image;

b) performing a SSFP pulse sequence series in which a subset of said set of steady-state free precession pulse sequences are performed to acquire a portion of the NMR data; and c) repeating steps a) and b) until all steady-state free precession pulse sequences in said set have been performed without any significant recovery period therebetween.

2. The method as recited in claim 1 in which the selected spin species is fat.

3. The method as recited in claim 1 in which the selected spin species is water.

4. The method as recited in claim 1 in which the NMR data is a 3DFT data set, in which each steady-state free precession pulse sequence includes a second magnetic field gradient, and in which step c) includes incrementing the value of the second magnetic field gradient before repeating steps a) and b).

* * * * *